US007895739B2

(12) United States Patent
Niklas et al.

(10) Patent No.: US 7,895,739 B2
(45) Date of Patent: Mar. 1, 2011

(54) APPARATUS FOR APPLYING SEMICONDUCTOR CHIP TO SUBSTRATES COMPRISING A MOVEABLE CURING DEVICE AND METHOD OF USE THEREOF

(76) Inventors: Sigmund Niklas, Zell (DE); Ewald Weckerle, Wenzenbach (DE); Uwe Timm, München (DE)

( * ) Notice: Subject to any disclaimer, the term of this patent is extended or adjusted under 35 U.S.C. 154(b) by 296 days.

(21) Appl. No.: 10/528,638

(22) PCT Filed: Sep. 27, 2003

(86) PCT No.: PCT/EP03/10778

§ 371 (c)(1), (2), (4) Date: Mar. 23, 2005

(87) PCT Pub. No.: WO2004/032202

PCT Pub. Date: Apr. 15, 2004

(65) Prior Publication Data

US 2006/0043584 A1 Mar. 2, 2006

(30) Foreign Application Priority Data

Sep. 28, 2002 (DE) ................................. 102 45 398

(51) Int. Cl.
*H01L 21/58* (2006.01)
*H05K 13/04* (2006.01)

(52) U.S. Cl. ................ 29/832; 29/740; 29/742; 156/578

(58) Field of Classification Search .................... 29/832, 29/834, 836, 854, 739, 740, 745, 757, 759, 29/742; 156/578, 499, 726, 727; 198/867.02, 198/867.14, 867.15, 465.1
See application file for complete search history.

(56) References Cited

U.S. PATENT DOCUMENTS

| | | | | |
|---|---|---|---|---|
| 5,916,513 | A | 6/1999 | Mangold et al. | 29/25.01 |
| 6,426,552 | B1 | 7/2002 | Reeder et al. | 257/724 |
| 6,436,223 | B1 | 8/2002 | Edwards et al. | 156/288 |
| 6,722,412 | B2 * | 4/2004 | Huang et al. | 156/499 |
| 2002/0195199 | A1 * | 12/2002 | Izutani et al. | 156/344 |

FOREIGN PATENT DOCUMENTS

| | | |
|---|---|---|
| DE | 10105164 | 5/2002 |
| DE | 10140661 | 1/2003 |
| EP | 0540797 | 5/1993 |
| EP | 1 170 788 A | 1/2002 |
| EP | 1170787 | 1/2002 |
| EP | 1 254 938 A | 11/2002 |
| JP | 07240435 A | 2/1994 |
| JP | 11040609 A | 10/1997 |
| JP | 2002110744 A | 9/2000 |
| JP | 2002270637 A | 3/2001 |
| JP | 2004-540732 | 1/2009 |
| WO | WO 98/28791 | 7/1998 |

* cited by examiner

*Primary Examiner* — A. Dexter Tugbang
*Assistant Examiner* — Livius R Cazan

(57) ABSTRACT

The invention relates to a device and a method for applying semiconductor chips (5) to a plurality of carriers (4), especially smart card modules or flexboards. According to the invention, an adhesive application device (1) is used to apply an adhesive to pre-defined positions on the carrier (4), a fitting device (2) is used to apply the semiconductor chips (5) to the positions on the carrier (4), and a hardening device (3) is used to harden the adhesive. The hardening device (3) and/or another device can be connected to a conveyor belt (6) for transporting the carrier (4) along the devices, by means of a clamping device (13, 14), and can be displaced in the transport direction at the speed of the conveyor belt (6), by means of a lifting device (15).

14 Claims, 3 Drawing Sheets

Figure 1A:
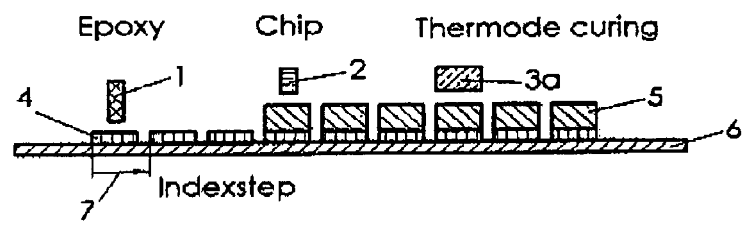

Epoxy-unit
Fitting device
1 2 3d 20 19 19 18 17 19 5 4 23 6 6 21 13 14 15 22 16

Epoxy-unit
Fitting device
1
2
3d
4
5
6
13
14
15
16
17
18
19
20
21
22
23

24a
25a
19
19
19
19
21
24b
6
25b

APPARATUS FOR APPLYING SEMICONDUCTOR CHIP TO SUBSTRATES COMPRISING A MOVEABLE CURING DEVICE AND METHOD OF USE THEREOF

CROSS REFERENCE TO RELATED APPLICATION

The present application is the national stage of International Application No. PCT/EP03/10778, which was filed on Sep. 27, 2003, and which claims priority to German Patent application No. 102 45 398.5, filed Sep. 29, 2002, which application is incorporated herein fully by this reference.

DESCRIPTION

The invention relates to an apparatus and a method for applying semiconductor chips to a plurality of substrates, in particular smartcard modules and flexboards.

Apparatuses for applying semiconductor chips to substrates, in particular for applying flip chips to smartcard modules or flexboards, usually have a first adhesive application device for applying adhesive to predefined substrate positions on the substrates, a second fitting device for fitting the substrates with flip chips at the substrate positions, and a third curing device for curing the adhesive. The chips to be flipped are in this case placed headfirst on the substrate during the fitting operation so that bumps on the flip chips make contact with the substrate material and can be connected to the substrate material during the curing operation by curing the previously applied adhesive.

The various devices are arranged one behind the other along a transport path and have different process times depending on the processing and/or control operations they carry out on the substrates and/or the semiconductor chips. As a result, for example on account of the relatively long curing time of the curing device, a fitting speed predefined by the fitting device is necessarily reduced since otherwise the substrates which have already been fitted would pile up on the transport path in front of the curing device. This in turn reduces the throughput of the apparatus as a whole.

Moreover, reliable control of the fitting positions is not possible on account of long control times and long transport paths.

Conventionally, in order to adapt the various process times to one another, the fitting speed of the fitting device is reduced such that the fitting time is matched to the curing time. The application of an adhesive in the form of a spot of epoxy to a substrate takes for example 300 ms per substrate. The fitting device requires a time period of 600 ms per fitting and the curing process as final bonding process takes 10 s. Accordingly, in the case of a step-wise movement of a transport path designed as a conveyor belt, on which the substrates are arranged one behind the other, the transport speed is reduced by, in each case, one index step in the transport direction to 10 s per index step in order to adapt the relatively short application and fitting times to the long curing time. The throughput of the apparatus is thereby reduced.

On the other hand, a curing process having a curing time which corresponds to the conventional fitting time of for example 600 ms is not possible on account of the compositions of the adhesives known to date, which do not allow such rapid curing.

Also known are apparatuses which have a buffer zone between the fitting device and the adhesive application device on one side and the curing device on the other side. Such buffer zones make it possible for already fitted substrates to wait in a type of waiting loop until a relatively large number of them can be passed to the curing device, which curing device comprises a number of processing units in the form of a thermode array for simultaneously curing a number of substrates with applied adhesive.

The processing devices arranged in the thermode array are individual thermodes and are arranged for this purpose in a two-dimensional manner, that is to say in the X-direction and Y-direction. The number of thermodes depends on the length of the curing time compared to the fitting time. If, for example, the curing time is 9.6 s and the fitting time is 600 ms, then a total of 16 thermodes are provided in the thermode array for the simultaneous processing of the substrates. In this way, although a high throughput of the apparatus can be maintained, the process accuracy of the device as a whole is adversely affected by the buffer zone on account of additional transport paths. The long transport paths additionally prevent the use of low-viscosity adhesives.

Furthermore, an apparatus is known in which, during the curing operation, a number of substrates with applied adhesive are cured simultaneously by means of a thermode array while the substrates and the conveyor belt carrying them are not moved. At the same time, a plurality of substrates are fitted by the fitting device while the conveyor belt is stationary. However, such an apparatus likewise requires a reduction in the fitting speed since long transport paths are necessary for the simultaneous fitting of a number of substrates. Moreover, on account of the long transport paths, the process accuracy of the apparatus as a whole is reduced.

EP 1 170 787 A1 discloses an apparatus and a method for mounting semiconductor chips on a flexible substrate, wherein the substrate, seen in the transport direction, is first carried by a support plate and then by a heating plate. The heating plate is moved in the transport direction in order to further transport the substrate, while by virtue of its heating function it cures the adhesive applied to the substrate. Such an apparatus likewise has a low throughput since each substrate, without the aid of a conveyor belt, has to be transported firstly by the support plate and then by the heating plate.

Accordingly, it is an object of the present invention to provide an apparatus and a method for applying semiconductor chips to substrates, in which a high throughput with a high fitting speed is possible despite the arrangement of at least one device with a long process time compared to a fitting time, while maintaining high process accuracy.

This object is achieved in terms of the apparatus in accordance with the features of claim 1 and in terms of the method in accordance with the features of claim 10.

One essential point of the invention is that, in an apparatus for applying semiconductor chips to a plurality of substrates, in particular smartcard modules or flexboards, in which at an adhesive application device adhesive is applied to the substrate at predefined substrate positions, at a fitting device the substrate is fitted with the semiconductor chips at the substrate positions, and in a curing device the adhesive is cured, the curing device and/or a further device can be connected by a clamping device to a conveyor belt which transports the substrates along the devices, and can be moved in the transport direction, at a transport speed of the conveyor belt, by a lifting device. In this way, while maintaining a short fitting time, processing by the curing device and/or the further device—which have a long process time (processing and/or control time) compared to the fitting time—is possible without the throughput of the apparatus as a whole being reduced. This is achieved by connecting the conveyor belt (which is moving in a step-wise manner) and the substrates arranged thereon to the curing device and/or a further device which is moved in its entirety at the transport speed just like the conveyor belt.

According to one preferred embodiment, in the curing device and/or the further device which can be connected to the conveyor belt, a plurality of processing and/or control units are arranged in the transport direction of the conveyor belt, which processing and/or control units carry out simultaneous processing and/or control of the substrates fitted with the semiconductor chips as they are transported. If the number of processing and/or control units depends on the multiple of a fitting time which is represented by a processing and/or control time of one unit, then simultaneous processing and/or control of the substrates can be carried out while the conveyor belt is moving, while the fitting operation is also being carried out. It is thus no longer necessary to match the fitting time to the processing and/or control time of the units. This therefore maintains the throughput predefined by the fitting time.

In order to adapt the sliding operation of the curing device and/or of the further device, in particular its return to a starting position, to the process flow of the apparatus as a whole, the apparatus has a timer device for setting a time duration which corresponds to the sum of the processing and/or control time of a processing and/or control unit and a time period which is required to return the moved curing device and/or the further device to a starting position in a direction counter to the transport direction.

Preferably, arranged in the curing device and/or the further device are the same number of processing and/or control units as the number of substrates moving in the transport direction which can be fitted by the fitting device at a predefined fitting speed within the processing and/or control time. Continuous processing/control of the substrates and of the semiconductor chips is thus possible at high throughput without the aid of a buffer zone.

According to one preferred embodiment, the movable curing device comprises, as processing units, a thermode array arranged above the conveyor belt, said thermode array comprising a plurality of thermodes assigned to the substrate positions of the substrates, and at least one heating plate arranged below the conveyor belt. The thermode array and the heating plate can be moved by a slide device in a direction perpendicular to the plane of the conveyor belt in such a way that, with the clamping device closed, they can be moved toward the conveyor belt and away from the conveyor belt. During the movement of the entire thermode array including the heating plate in the transport direction, the plurality of thermodes allows simultaneous curing of a number of substrates provided with adhesive with semiconductor chips applied thereon.

The clamping device consists of at least two clamping jaw units which are preferably arranged at end regions of the movable curing device and/or of the further device, the upper and lower clamping jaws of which can be guided toward the conveyor belt from above and below. In this way, the elements which are to be joined, such as substrate and semiconductor chip, are arranged in a stationary manner with respect to the thermodes, in order to ensure precise positioning of the thermodes with respect to the individual substrates during the joining operation.

The lifting device is connected to a conveyor belt drive for moving the conveyor belt in a step-wise manner in the transport direction. This ensures precise matching of the movement speed of the curing device to be moved to the transport speed of the conveyor belt.

Furthermore, the apparatus according to the invention has a further clamping device, fixed to the apparatus, for keeping the conveyor belt stationary while the moved curing device and/or the further device is being returned in the direction counter to the transport direction.

A method according to the invention for applying semiconductor chips to a plurality of substrates preferably comprises the following steps:

- connecting the curing device and/or a further device to a conveyor belt which transports the substrates along the devices, by closing a first clamping device;
- opening a second clamping device, fixed to the apparatus, so as to release the conveyor belt moving in the transport direction;
- moving processing and/or control units arranged in the curing device and/or the further device into a closed position in a direction perpendicular to the plane of the conveyor belt;
- moving the curing device and/or the further device at a transport speed of the conveyor belt in the transport direction during a simultaneous processing and/or control of a plurality of substrates fitted with the semiconductor chips for a predefined processing and/or control time by means of the processing and/or control units;
- moving the processing and/or control units into an open position away from the plane of the conveyor belt following expiry of the processing and/or control time;
- closing the second clamping device which is fixed to the apparatus;
- opening the first clamping device;
- returning the curing device and/or the further device to a starting position in a direction counter to the transport direction.

The step of moving the processing and/or control units into an open position can be carried out independently of a movement of the conveyor belt in the transport direction on account of the curing device and/or further device which moves therewith.

To achieve as high a throughput as possible, the transport speed corresponds to the fitting speed at which the substrates on the conveyor belt are fitted, said conveyor belt moving in a step-wise manner.

Further advantageous embodiments emerge from the dependent claims.

Figure 2:
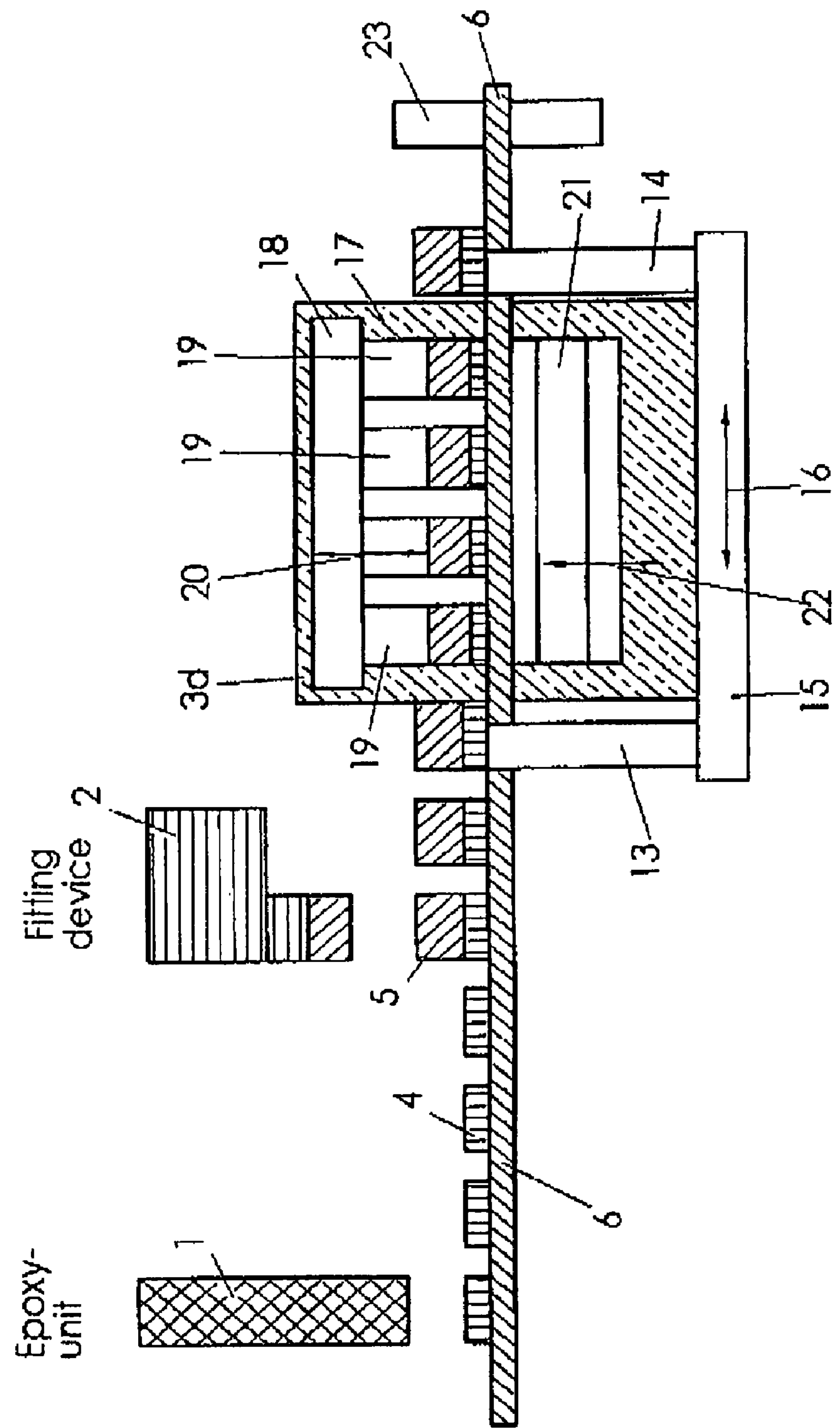
Figure 3:
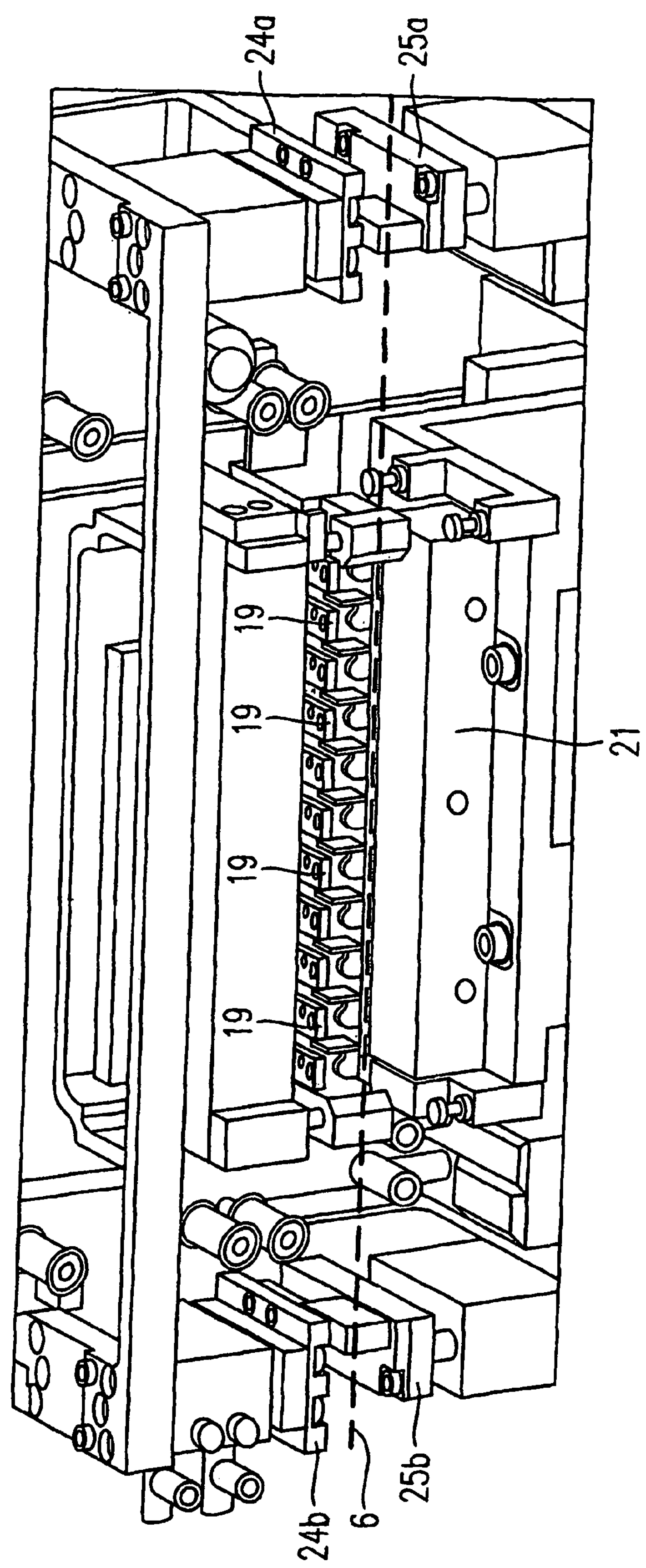

Advantages and expediencies can be found in the following description in conjunction with the drawing, in which:

FIGS. 1*a*-1*d* show, in each case in a schematic cross-sectional view, four different apparatuses for applying semiconductor chips to substrates according to the prior art;

FIG. 2 shows, in a schematic cross-sectional view, an apparatus for applying semiconductor chips to substrates according to one embodiment of the invention; and FIG. 3 shows, in a perspective view, a detail of the apparatus shown schematically in FIG. 2, which detail shows a movable curing device.

FIGS. 1*a*-1*d* show, in each case in a schematic cross-sectional view, four different apparatuses for applying semiconductor chips to substrates according to the prior art. The apparatuses shown in FIGS. 1*a-d* are in each case composed of an adhesive application device 1 for applying an adhesive in the form of a spot of epoxy to substrates, a fitting device 2 for fitting the substrates with semiconductor chips, and a curing device 3*a*, 3*b*, 3*c* for curing the adhesive. The substrates 4 are arranged one behind the other continuously on a conveyor belt 6 and move with the latter in a step-wise manner in each case by one index step in the transport direction, which is shown by the arrows 7 and 9.

Usually, the application of the adhesive takes 300 ms, the fitting with semiconductor chips 4 designed as flip chips takes 600 ms and the thermode curing in the curing device takes 10 s.

In the apparatus shown in FIG. 1*a*, a fitting time in which a substrate 4 is fitted with a flip chip is matched to the curing time, so that a fitting speed depends on the significantly longer curing time. This results in a significant reduction in the throughput of the apparatus as a whole.

Figure 1B:
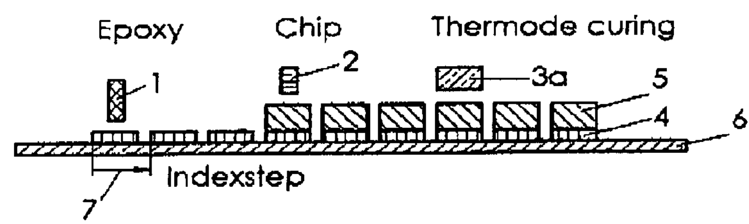

The apparatus shown in FIG. 1*b* has a curing device 3*a*, the curing time of which is reduced to the fitting time of 600 ms. This means that the previously applied adhesive is not reliably cured, and thus a reliable connection of the flip chips 5 provided with bumps to the substrates 4 does not take place.

Figure 1C:
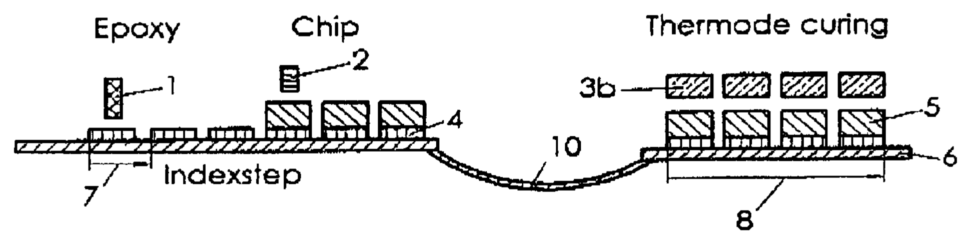

The apparatus shown in FIG. 1*c* comprises a buffer zone 10 between the fitting device 2 and the adhesive application device 1 on one side and the curing device 3 on the other side. In the buffer zone 10, the already fitted substrates 4 are left in a type of waiting loop to wait until a relatively large number of said substrates are introduced into the curing device 3*b*, which curing device has a number of processing units in the form of a thermode array for the simultaneous curing of a number of substrates with applied adhesive.

The processing devices arranged in the thermode array are individual thermodes and, for the simultaneous curing of as many adhesives as possible, are arranged in a two-dimensional manner, that is to say in the X-direction and in the Y-direction.

The curing time is 9.6 s and the fitting time is 600 ms. Accordingly, the thermode array has a total of 16 thermodes for the simultaneous curing of the adhesives, while 16 new substrates can be fitted at the same time. In this way, although a high throughput of the apparatus can be maintained, the process accuracy of the apparatus as a whole is adversely affected by the buffer zone on account of additional transport paths.

Figure 1D:
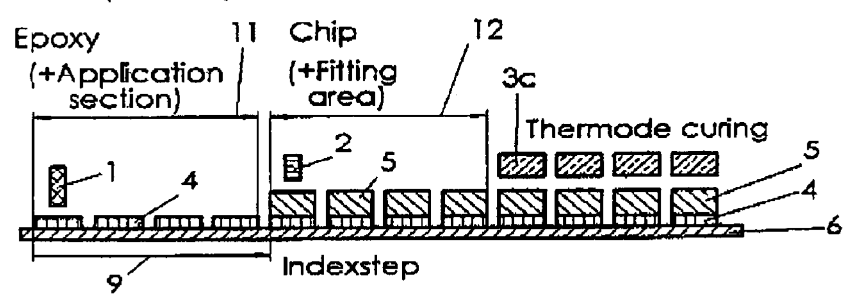

FIG. 1*d* shows an apparatus in which, during the curing operation, a number of substrates 4 with applied adhesive are cured simultaneously by a thermode array 3*c* while the substrates 4 and the conveyor belt 6 carrying them are not moving. At the same time, a plurality of substrates 4 is fitted by the fitting device 2 while the conveyor belt 6 is stationary. The required index step for the step-wise movement of the conveyor belt 6 is thus significantly larger, as shown by the arrow 9. This is also shown by the indicated lengths of a fitting area 12 and an adhesive application section 11. However, such an apparatus also requires a reduction in the fitting speed since long transport paths are necessary for the simultaneous fitting of a number of substrates. Moreover, on account of the long transport paths, the process accuracy of the apparatus as a whole is reduced.

FIG. 2 shows, in a schematic cross-sectional view, an apparatus for applying semiconductor chips to substrates according to one embodiment of the invention. The apparatus likewise has an adhesive application device 1, a fitting device 2 and a curing device 3*d*. The curing device 3*d* can be connected to the conveyor belt 6 by a clamping device comprising two clamping jaw units 13 and 14 fitted at the ends. The clamping jaw units 13 and 14 are connected to lifting device 15 arranged below the conveyor belt. The lifting device 15 is connected to a conveyor belt drive (not shown here) which is provided for transporting both the conveyor belt and also the curing device 3*d* in the transport direction of the conveyor belt 6.

The curing device 3*d* can be moved in the transport direction and counter to the transport direction, as shown by the arrows 16.

The curing device 3*d* is composed of processing and/or control units, such as a thermode array 18 and/or a heating plate 21. The thermode array 18 is arranged in a housing 17 and comprises individual thermodes 19, wherein each of the thermodes 19 is assigned to a substrate position at which adhesive and a flip chip 5 have been applied.

The thermodes can be moved back and forth in the direction of the arrow 20 vertically with respect to the conveyor belt 6.

Furthermore, in the housing 17 a heating plate 21 is arranged on the underside of the conveyor belt 6, which heating plate can be moved in the direction of the arrow 22 toward the conveyor belt 6 and away from the latter.

The mode of operation of the apparatus according to the invention is shown on the basis of the method described below:

In a first step, the curing device 3*d* is fixedly connected to the conveyor belt by closing the clamping jaw units 13 and 14.

In a second step, a further clamping device 23 which is fixed to the apparatus is opened in order to release the conveyor belt 6.

In a third step, the thermode array 18 and the heating plate 21 are moved toward the conveyor belt 6 in the direction of arrows 20 and 22, in order to bring these elements into a closed position.

In a fourth step, the entire curing device 3*d* is then moved, at the transport speed of the conveyor belt 6, in the transport direction which runs to the right in the plane of the drawing. At the same time, the thermodes 19 and the heating plate 21 cure the applied adhesive at the substrate positions of the substrates 4.

Once the curing operation is complete, the thermode array 18 and the heating plate 21 are opened again.

The further clamping device 23 is then closed and the clamping jaw units 13 and 14 are opened.

The entire curing device 3*d* is then returned to a starting position in a direction counter to the transport direction.

FIG. 3 shows, in a perspective view, a detail of the apparatus shown schematically in FIG. 2, which detail shows the movable curing device 3*d*. It can be seen from this diagram that the thermodes 19, eleven of which can be seen in total, are arranged above the conveyor belt 6 and the heating plate 21 is arranged below the conveyor belt 6.

The clamping jaw units provided at the ends are in each case composed of an upper clamping jaw 24*a*, 24*b* and a lower clamping jaw 25*a*, 25*b*, which in the closed position are pressed against the upper side and underside of the conveyor belt 6.

At this point, it should be mentioned that all the parts described above are claimed as essential to the invention both per se and in any combination, in particular the details shown in the drawing. The person skilled in the art will be familiar with modifications thereto. By way of example, the curing device may be replaced by any desired control device, the process time of which likewise exceeds the fitting time and thus allows connection and movement of the control device to and with the conveyor belt.

List of References

1 adhesive application device
2 fitting device
3, 3*a*, 3*b*, 3*c*, 3*d* curing device
4 substrates
5 flip chips
6 conveyor belt
7, 8, 9 transport direction with index steps

10 buffer zone
11 application section
12 length of fitting area
13, 14 clamping jaw units
15 connecting element
16 movement direction
17 housing
18 thermode array
19 thermodes
20, 22 movement directions
21 heating plate
23 clamping device
24*a*, 24*b* upper clamping jaws
25*a*, 25*b* lower clamping jaws

The invention claimed is:

1. An apparatus for applying semiconductor chips to a plurality of substrates, wherein at an adhesive application device adhesive is applied to the substrates at predefined substrate positions, at a fitting device the substrates are fitted in a defined fitting time with the semiconductor chips at the substrate positions, and in a curing device the adhesive is cured in a process time substantially exceeding the fitting time, wherein the curing device is connectable by a clamping device to a conveyor belt which transports the substrates in a transport direction along the adhesive application and fitting devices, and wherein the curing device is movable in the transport direction, at a transport speed of the conveyor belt, by a lifting device, wherein, in the curing device which is connectable to the conveyor belt, a plurality of processing units are arranged in the transport direction of the conveyor belt, which processing units carry out simultaneous processing of the substrates fitted with the semiconductor chips as they are transported, or a plurality of control units are arranged in the transport direction of the conveyor belt, which control units carry out simultaneous control of the substrates fitted with the semiconductor chips as they are transported;

further comprising a timer device for setting a time duration, wherein, if the plurality of processing units are arranged in the transport direction of the conveyor belt, the time duration corresponds to the sum of a processing time of a processing unit and a time period which is required to return the curing device to a starting position in a direction counter to the transport direction, and wherein, if the plurality of control units are arranged in the transport direction of the conveyor belt, the time duration corresponds to the sum of a control time of a control unit and a time period which is required to return the curing device to a starting position in a direction counter to the transport direction.

2. The apparatus as claimed in claim 1, wherein arranged in the curing device are the same number of processing units as the number of substrates moving in the transport direction which can be fitted by the fitting device at a predefined fitting speed within the processing time.

3. The apparatus as claimed in claim 1, wherein the movable curing device comprises a thermode array arranged above the conveyor belt, said thermode array comprising a plurality of thermodes assigned to the substrate positions of the substrates, and at least one heating plate arranged below the conveyor belt.

4. The apparatus as claimed in claim 3, wherein the thermode array and the heating plate are movable by a slide device in a direction perpendicular to the plane of the conveyor belt in such a way that, with the clamping device closed, they are movable toward the conveyor belt and away from the conveyor belt.

5. The apparatus as claimed in claim 1, wherein the lifting device is connected to a conveyor belt drive for moving the conveyor belt in a step-wise manner in the transport direction.

6. The apparatus as claimed in claim 1, further comprising a further clamping device, fixed to the apparatus, for keeping said conveyor belt stationary while the curing device is being returned in the direction counter to the transport direction.

7. The apparatus as claimed in claim 1, wherein, arranged in the curing device are the same number of control units as the number of substrates moving in the transport direction which can be fitted by the fitting device at a predefined fitting speed within the control time.

8. A method for applying semiconductor chips to a plurality of substrates, wherein at an adhesive application device adhesive is applied to the substrates at predefined substrate positions, at a fitting device the substrates are fitted in a defined fitting time with the semiconductor chips at the substrate positions, and in a curing device the adhesive is cured, the method comprising:

connecting the curing device, which has a process time for curing the adhesive that substantially exceeds the fitting time, to a conveyor belt which transports the substrates in a transport direction along the adhesive application and fitting devices, by closing a first clamping device; wherein units are arranged in the curing device, and wherein the units are one of processing units and control units;

opening a second clamping device, fixed to the apparatus, so as to release the conveyor belt which is moving in the transport direction;

moving the units into a closed position in a direction perpendicular to the plane of the conveyor belt, wherein, if the units are processing units, moving the curing device at a transport speed of the conveyor belt in the transport direction during a simultaneous processing of a plurality of substrates fitted with the semiconductor chips for a predefined processing time by means of the processing units and the processing units are moved into an open position away from the plane of the conveyor belt following expiry of the processing time and wherein, if the units are control units, the curing device is moved at a transport speed of the conveyor belt in the transport direction during a simultaneous control of a plurality of substrates fitted with the semiconductor chips for a predefined control time by means of the control units and the control units are moved into an open position away from the plane of the conveyor belt following expiry of the control time;

closing the second clamping device which is fixed to the apparatus;

opening the first clamping device; and returning the curing device to a starting position in a direction counter to the transport direction.

9. The method as claimed in claim 8, wherein the step of moving the units into an open position can be carried out independently of a movement of the conveyor belt in the transport direction.

10. The method as claimed in claim 9, wherein the transport speed corresponds to a fitting speed at which the substrates on the conveyor belt are fitted, said conveyor belt moving in a step-wise manner.

11. The method as claimed in claim 8, wherein the transport speed corresponds to a fitting speed at which the substrates on the conveyor belt are fitted, said conveyor belt moving in a step-wise manner.

12. An apparatus for applying semiconductor chips to a plurality of substrates, wherein at an adhesive application device adhesive is applied to the substrates at predefined substrate positions, at a fitting device the substrates are fitted in a defined fitting time with the semiconductor chips at the substrate positions, and in a curing device the adhesive is cured, wherein the curing device, which has a process time for curing the adhesive that substantially exceeds the fitting time, is connectable by a clamping device to a conveyor belt which transports the substrates in a transport direction along the adhesive application and fitting devices, and wherein the curing device is movable in the transport direction, at a transport speed of the conveyor belt, by a lifting device; wherein the clamping device comprises at least two clamping jaw units which are arranged at end regions of the movable curing device, each of the clamping jaw units comprising upper and lower clamping jaws which are guidable toward the conveyor belt from above and below.

13. The apparatus as claimed in claim 12, wherein, in the curing device which is connectable to the conveyor belt, a plurality of processing units are arranged in the transport direction of the conveyor belt, which processing units carry out simultaneous processing of the substrates fitted with the semiconductor chips as they are transported.

14. The apparatus as claimed in claim 12, wherein, in the curing device which is connectable to the conveyor belt, a plurality of control units are arranged in the transport direction of the conveyor belt, which control units carry out simultaneous control of the substrates fitted with the semiconductor chips as they are transported.

* * * * *

UNITED STATES PATENT AND TRADEMARK OFFICE

CERTIFICATE OF CORRECTION

PATENT NO. : 7,895,739 B2
APPLICATION NO. : 10/528638
DATED : March 1, 2011
INVENTOR(S) : Niklas et al.

It is certified that error appears in the above-identified patent and that said Letters Patent is hereby corrected as shown below:

On the Title page Please Add:

Item (73) Assignee: Mühlbauer AG, Roding (DE)

Signed and Sealed this
Fifth Day of April, 2011

David J. Kappos
*Director of the United States Patent and Trademark Office*